US008330945B2

(12) United States Patent
Choi et al.

(10) Patent No.: US 8,330,945 B2
(45) Date of Patent: Dec. 11, 2012

(54) MULTI-PURPOSE PLASMONIC AMBIENT LIGHT SENSOR AND VISUAL RANGE PROXIMITY SENSOR

(75) Inventors: Byung Choi, Pittsburgh, PA (US); Min Kyu Song, Pittsburgh, PA (US); Byounghee Lee, Pittsburgh, PA (US)

(73) Assignee: NanoLambda, Inc., Pittsburgh, PA (US)

( * ) Notice: Subject to any disclaimer, the term of this patent is extended or adjusted under 35 U.S.C. 154(b) by 213 days.

(21) Appl. No.: 12/933,802

(22) PCT Filed: Mar. 19, 2009

(86) PCT No.: PCT/US2009/037621
§ 371 (c)(1),
(2), (4) Date: Dec. 14, 2010

(87) PCT Pub. No.: WO2009/120568
PCT Pub. Date: Oct. 1, 2009

(65) Prior Publication Data
US 2011/0086676 A1     Apr. 14, 2011

Related U.S. Application Data

(60) Provisional application No. 61/064,732, filed on Mar. 24, 2008.

(51) Int. Cl.
*G01J 1/42* (2006.01)
(52) U.S. Cl. ... 356/218; 356/445; 359/585; 250/214 AL
(58) Field of Classification Search ......... 356/213–235, 356/445–448; 250/208.2, 214 DC, 214 R, 250/551, 221; 359/359, 885
See application file for complete search history.

(56) References Cited

U.S. PATENT DOCUMENTS

| 5,313,264 | A | 5/1994 | Ivarsson et al. | |
|---|---|---|---|---|
| 7,460,238 | B2 * | 12/2008 | Skorobogatiy et al. | 356/447 |
| 2002/0003378 | A1 * | 1/2002 | Marcus et al. | 307/10.1 |
| 2007/0051881 | A1 | 3/2007 | Ashdown | |
| 2009/0141343 | A1 * | 6/2009 | Leard | 359/359 |
| 2010/0046060 | A1 * | 2/2010 | Lee et al. | 359/277 |
| 2010/0046077 | A1 * | 2/2010 | Lee et al. | 359/585 |
| 2011/0006188 | A1 * | 1/2011 | Lin | 250/201.1 |
| 2011/0068255 | A1 * | 3/2011 | Zheng et al. | 250/208.2 |
| 2012/0133799 | A1 * | 5/2012 | Findlay | 348/241 |

FOREIGN PATENT DOCUMENTS
KR    10-2003-0042576 A    6/2003

OTHER PUBLICATIONS

International Bureau of WIPO. International Preliminary Report on Patentability, Intl. Application PCT/US2009/037621. Oct. 7, 2010.
International Search Report and Written Opinion of the International Search Authority, Intl. Application PCT/US2009/037621. ISA/KR (Korean Intellectual Property Office), Oct. 29, 2009.

* cited by examiner

*Primary Examiner* — Hoa Pham
(74) *Attorney, Agent, or Firm* — The Marbury Law Group PLLC

(57) ABSTRACT

A visible wavelength range proximity sensor includes a visible light emitter with a peak wavelength in a visible wavelength range, and a plasmonic ambient light sensor, where a proximity sensing mode and an ambient light sensing mode are time multiplexed.

21 Claims, 5 Drawing Sheets

MULTI-PURPOSE PLASMONIC AMBIENT LIGHT SENSOR AND VISUAL RANGE PROXIMITY SENSOR

CROSS-REFERENCE TO RELATED PATENT APPLICATIONS

The present application claims benefit of U.S. provisional application 61/064,732, filed Mar. 24, 2008, and is a U.S. national stage application of Patent Cooperation Treaty application PCT/US2009/037621, filed Mar. 19, 2009, which are incorporated herein by reference in their entirety.

BACKGROUND OF THE INVENTION

Ambient light sensing has traditionally been used in industrial applications involving photometry, and over the years was incorporated in some consumer electronics appliances involving displays such as LCDs, FPDs, plasma displays, HDTVs, computer displays, camcorders etc., for brightness control. Lately, the concept has started to appear in handheld devices such as PDAs, MP3 players, PMP players and mobile phones. The inclusion of ambient light sensing provides a reduction in battery power usage, which is important given the introduction of power hungry color LCD displays. Studies have shown that backlighting is only required about 40% of the time. If there is a way to automatically adjust the backlighting (such as by autodimming) to be on only when needed, considerable power savings can be achieved.

The ideal ambient sensor to save the most battery power is a sensor which has same spectral response as the human eye spectral response (V-lambda). Although this ideal ambient light sensor can be technically fabricated by using multilayered dielectric filter technology, the high cost associated with such dielectric filter technology presents a cost barrier for its use in cost demanding consumer display applications, especially in mobile devices. Therefore, a large number of the current ambient light sensor products on the market are using low cost filters which have broader spectral responses, especially into IR (Infra Red) ranges, than the human eye spectral response. Because of this spectral broadness, these ambient light sensors cannot save the battery power as wanted.

References (incorporated herein by reference in their entirety):
TAOS066G, Product brochure for TSL2562, TSL2563 Low-Voltage Light-to-Digital Converter, Texas Advanced Optoelectronic Solutions, 2007;
5988-9361EN_avago.pdf, White Paper, Ambient Light Sensing using HSDL-9000, 2006;
Osram_Appnote_for_Ambient_light_sensor_SFH_3410_and_SFH_3710, Osram Ambient Light Sensor Application Note, 2006;
AV02-0779EN.pdf, HSDL-9100 Surface-Mount Proximity Sensor, Data Sheet, Avago Technologies, 2008;
Integrated Proximity Sensor and Ambient Light Sensor, United States Published Patent Application number US 2008/0006762 A1, Jan. 10, 2008.

SUMMARY OF THE INVENTION

The spectral response of the ambient light sensor is improved when a plasmonic ambient light sensor with plasmonic optical filter close to the human eye spectral response (V-lambda) is used. This provides a further opportunity to save power or battery life. As used herein, the term human eye spectral response includes the visible wavelength range (400 nm to 700 nm), preferably 500 nm to 600 nm, most preferably 540 nm to 570 nm. The term "close" as used herein provides for a 20% or less, such as 10% or less deviation from the human eye spectral response.

In another embodiment, this plasmonic ambient light sensor can be used in a proximity sensor for mobile devices (such as mobile phones, PDAs (including email sending devices), MP3 players, PMP players, etc.) by integrating the ambient light sensor with a visible light emitting device, such as a green LED which has center wavelength at the peak wavelength of human eye spectral response. The proximity sensor can further save battery power by turning off the display screen when the mobile devices are placed near objects, such as the human ear. The proximity sensor can also be used to lock the touch screen function when the devices are near human face to prevent wrong touch screen inputs by users' face. Traditionally, most proximity sensors use IR(Infra Red) LED as an emitter and IR photodiode as a detector. Since the working wavelength range, IR(Infra Red), for proximity sensor and the target wavelength range, visual, of the spectral response of the ambient light sensor are different, it is not feasible to use the ambient light sensor as a detector part of the proximity sensor. Therefore, two separate sensors (the ambient light sensor and the proximity sensor) are used in prior art mobile devices. However, it is possible to integrate the ambient light sensor as detection part of the proximity sensor to make two separate components into one single component, if the plasmonic ambient light sensor with plasmonic optical filter close to the human eye spectral response (V-lambda) is used. This will further save footprint of components on limited space and area within the mobile devices.

Thus, one embodiment of the invention provides a plasmonic ambient light sensor made of a photodiode (or another photodetector) and a plasmonic optical filter to have the combined spectral response close to human eye spectral response. Another embodiment of the invention integrates this plasmonic ambient light sensor with a visible light emitter, such as a green LED, to form a visual range proximity sensor with time division multiplexing technique. The emitting light is modulated to distinguish the light from emitter from the ambient light. The green LED emitter in this integrated proximity sensor may be used as indicator light, such as an indicator to show an incoming call or that a message arrived on a mobile phone or PDA.

DETAILED DESCRIPTION OF THE PREFERRED EMBODIMENTS

Unless otherwise specified, the words "a" or "an" as used herein mean "one or more". The term "light" includes visible light as well as UV and IR radiation. The invention includes the following embodiments.

Figure 1:
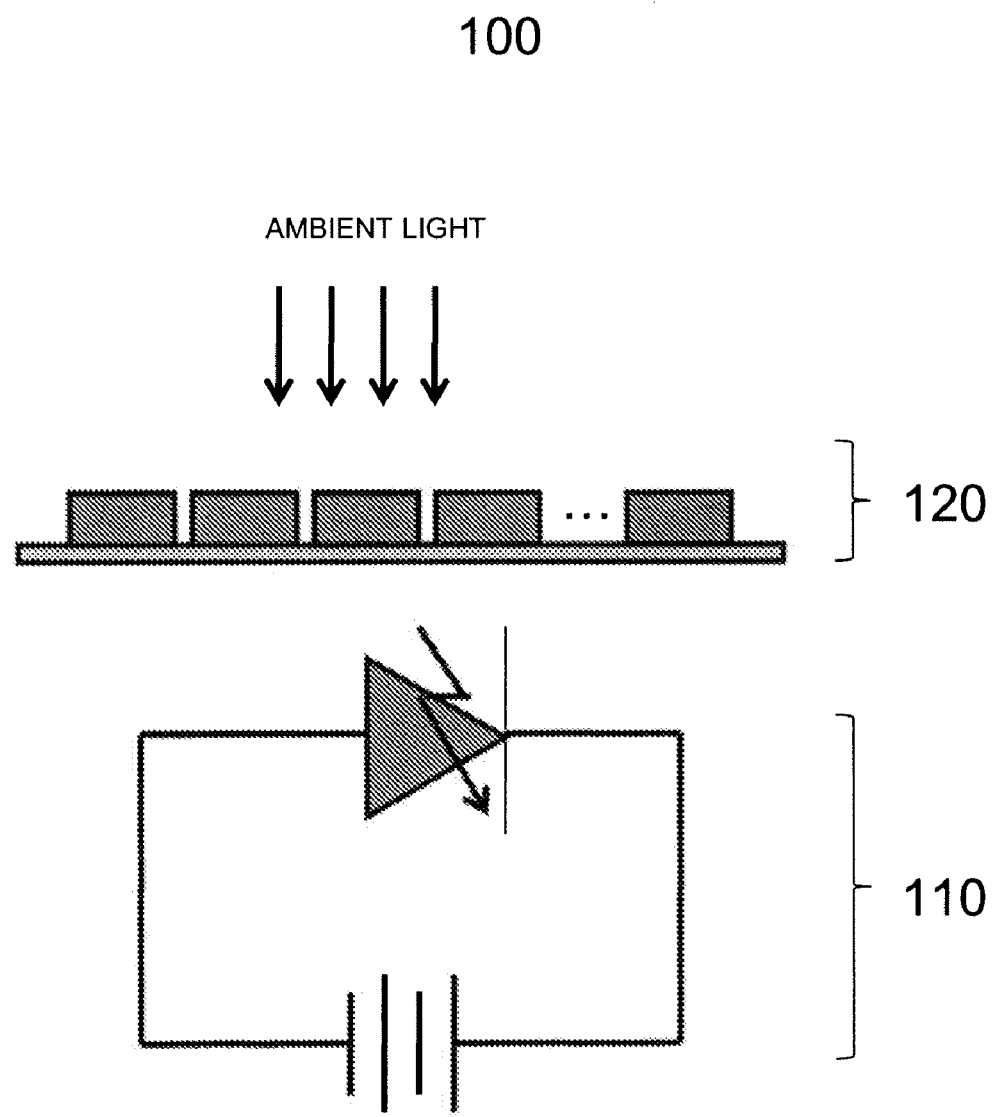
FIG. 1 is a schematic representation of plasmonic ambient light sensor using a plasmonic optical filter device.

In FIG. 1, a plasmonic ambient light sensor 100 is shown containing a photodetector 110 and a plasmonic optical filter device 120. The examples of plasmonic optical filter structures are shown in FIGS. 2A, 2B, 2C and 2D.

Any suitable plasmonic optical filter structures may be used. Non-limiting examples of such filter structures are described in the following patent applications, which are incorporated by reference herein in their entirety:

WAVELENGTH SELECTIVE METALLIC EMBOSSING NANOSTRUCTURE, PCT patent application serial number PCT/US2007/026135 filed on Dec. 21, 2007 which claims priority to U.S. Provisional Application Ser. No. 60/877,660, filed on Dec. 29, 2006;

PLASMONIC FABRY-PEROT FILTER, PCT patent application serial number PCT/US2007/026071 filed on Dec. 21, 2007;

TUNABLE PLASMONIC FILTER, PCT patent application serial number PCT/US2007/026069 filed on Dec. 21, 2007.

Figure 2A:
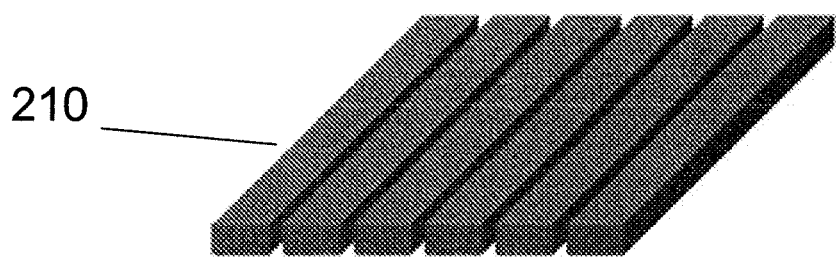
FIGS. 2A, 2B, 2B and 2D show the perspective view of different types of plasmonic optical filter devices.
Figure 2B:
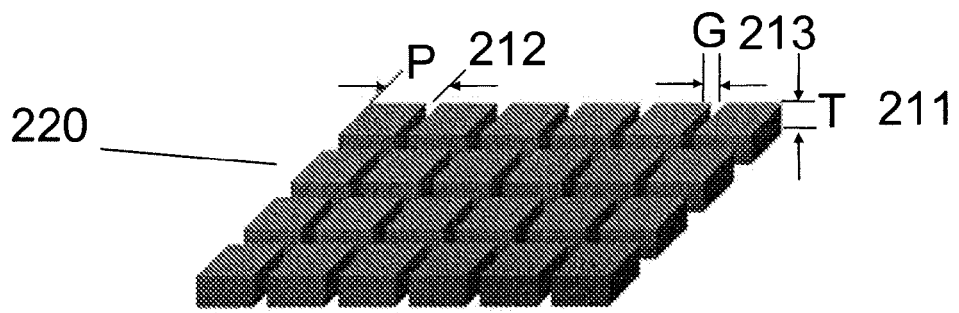
Figure 2C:
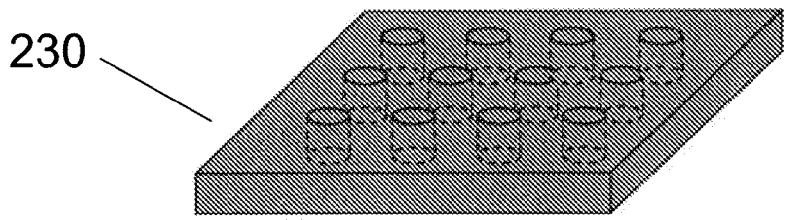
Figure 2D:
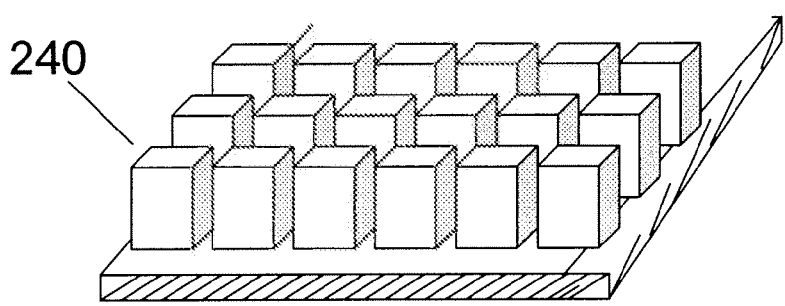

In a plasmonic optical filter device 120, metal plasmonic structures are configured such that when light is incident on the structures, at least one plasmon mode is resonant with the incident light to produce a transmission spectral window with desired spectral profile, bandwidth and beam shape. In FIGS. 2A and 2B, the metallic plasmonic structures comprise metal islands 210, 220 which are separated from adjacent islands in one dimension as shown in FIG. 2A or in two dimensions as shown in FIG. 2B. In FIG. 2C, the plasmonic structures comprise a metallic film 230 with apertures or holes. In FIG. 2D, the plasmonic structures comprise metallic embossing structures 240 on a substrate, such as a metal, semiconductor or insulating film. The spectral responses of the plasmonic optical filters can be designed by changing the metal materials and dielectric materials and the shapes or structures such as thickness (T) 211, pitch (P) 212 and/or gap (G) 213 between the structures 220, as shown for example in FIG. 2B. Likewise, the pitch or size of openings in FIG. 2C may also be varied to obtain desired properties.

Figure 3A:
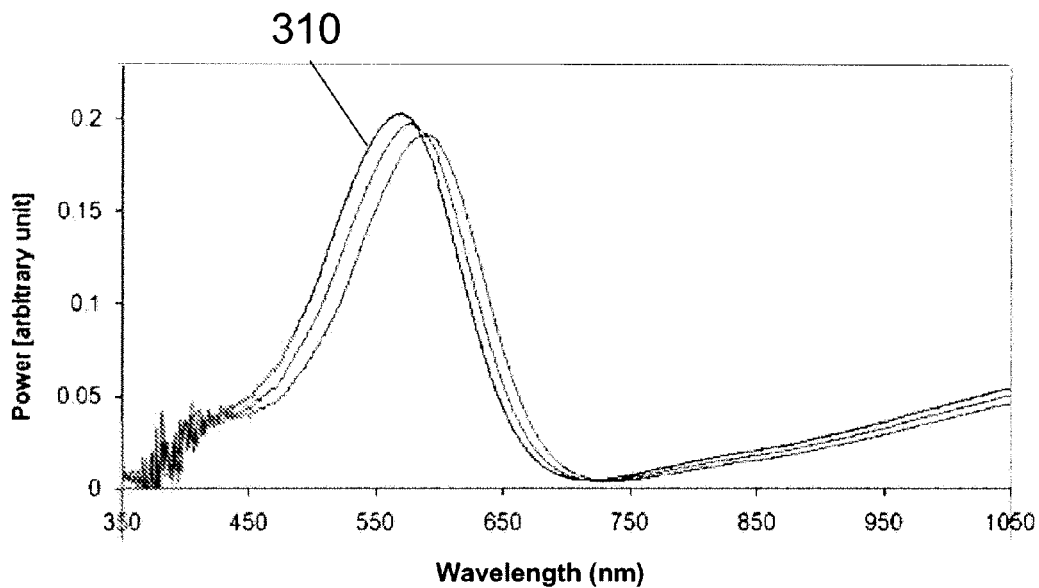
FIGS. 3A and 3B are graphical representations of spectral response curves of plasmonic optical filter devices in comparison with human eye spectral response.
Figure 3B:
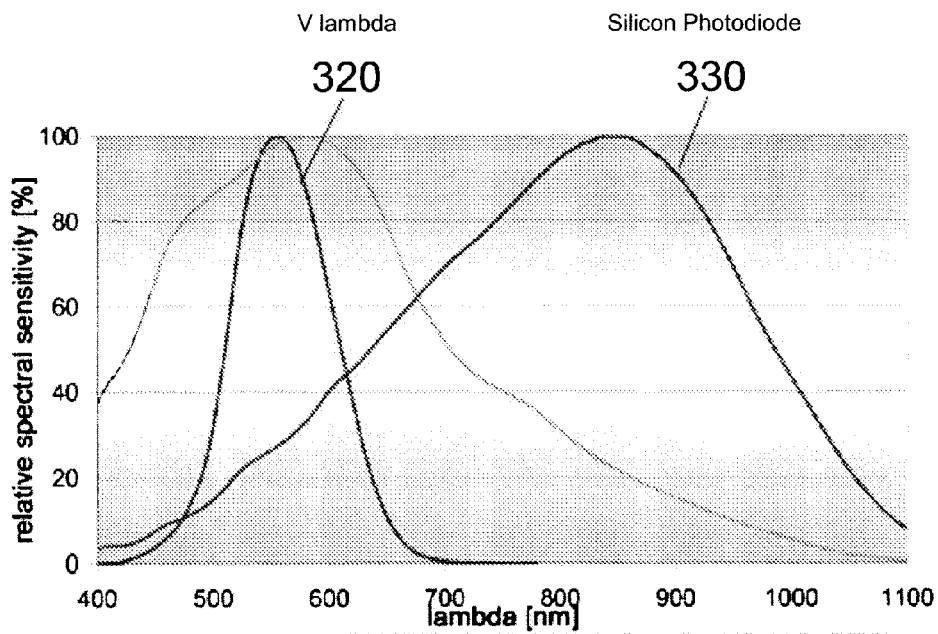

In FIG. 3A, the measured spectral responses 310 of the plasmonic optical filters show single peak close to the peak of human eye spectral response 320 in FIG. 3B. Also in FIG. 3A, it is shown that the spectral responses 310 of the plasmonic optical filter have active spectral response ranges close to the human eye spectral response 320 in FIG. 3B. The IR(Infra Red) part of the spectral responses is significantly lower than the visible light range response. This close to human eye spectral response will further save the battery power by removing the possibility of increasing the display brightness under significant IR(Infra Red) ambient light environment.

Figure 4:
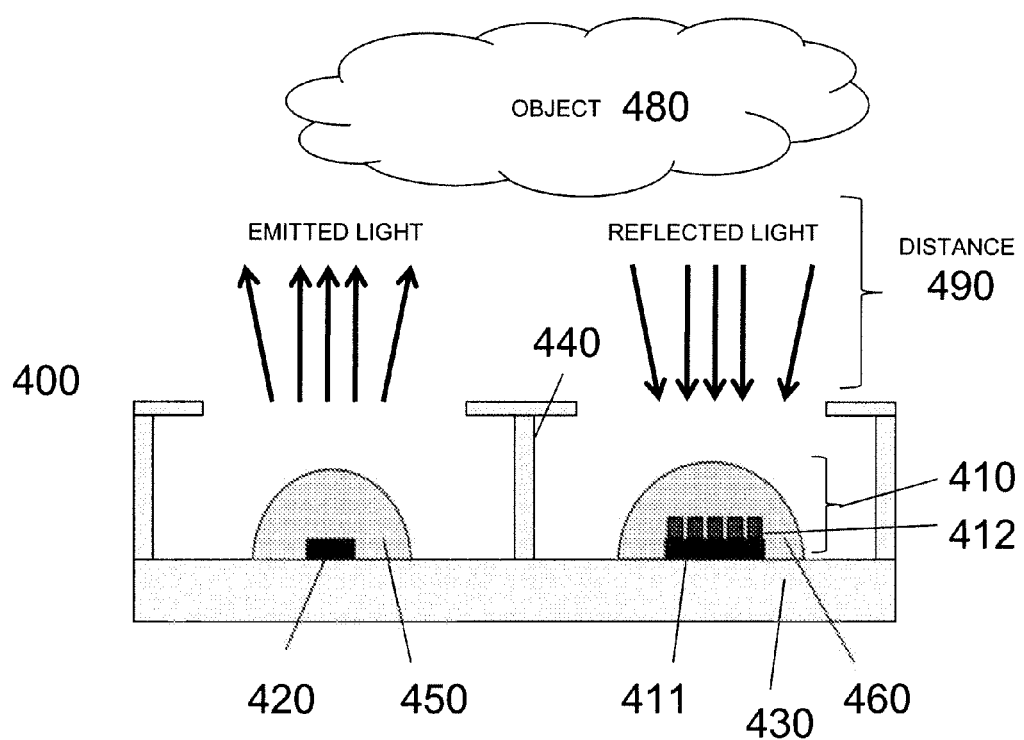
FIG. 4 is a schematic representation of the integration of visual range LED and the plasmonic ambient light sensor in a single component package.

This very narrow spectral responses of plasmonic ambient light sensor can be used for the detection part of the proximity sensor to make an integrated sensor 400. Sensor 400 may be used for mobile devices, such as mobile phones or PDAs, or for other devices. In FIG. 4, the plasmonic ambient light sensor 410 (comprising plasmonic features 412 over a substrate 411) and the visible light emitting LED 420, preferably green LED with center wavelength between 540 nm and 570 nm, are packaged in the same component housing 430, separated by optically opaque material 440 to prevent the LED light leaking directly to plasmonic ambient light sensor. Lenses 450, 460 may be used to direct, collimate or focus the lights. In certain applications, the LED can be located outside of the module or housing 430.

Figure 5:
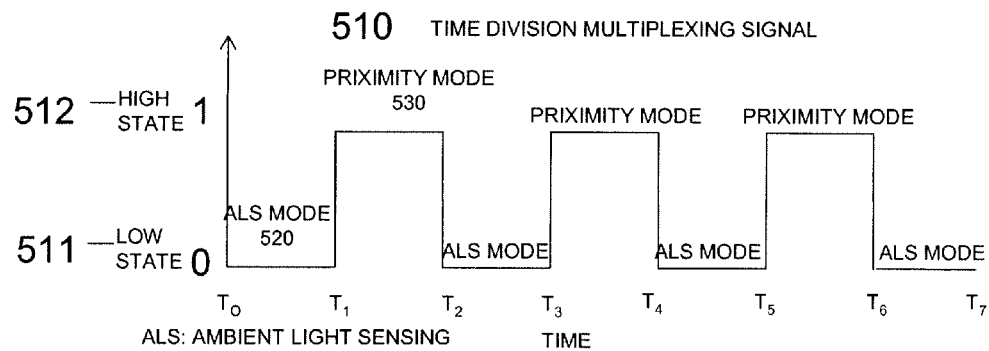
FIG. 5 shows the conceptual diagram for time division multiplexing for ambient light sensor mode and proximity sensor mode.

Since the same detector is used for both ambient light sensing and proximity sensing, the time division multiplexing technique is now used to separate two operations. In FIG. 5, the time division multiplexing signal 510 is shown. In low state 511 of this time division multiplexing signal 510, the detector operation is used for ambient light sensing mode 520. In high state 512 of this time division multiplexing signal 510, the detector operation is used for proximity sensing mode 530. The multiplexing signal may be processed in a processor, such as a computer or a logic chip or circuit. The processor may be physically integrated with the sensor 400 or the processor may be located separately from the sensor 400 and receive a signal from the sensor 400 wirelessly, optically or electrically via bus or cord. The sensor 400 may include a modulation unit to generate the modulation signal and signal processing (or subtraction) unit to extract the modulated light from the background ambient light, as will be described in more detail below. The modulation unit may comprise a portion of the photodetector or a portion of the processor, while the processing (subtraction) unit is preferably included in the processor.

Figure 6:
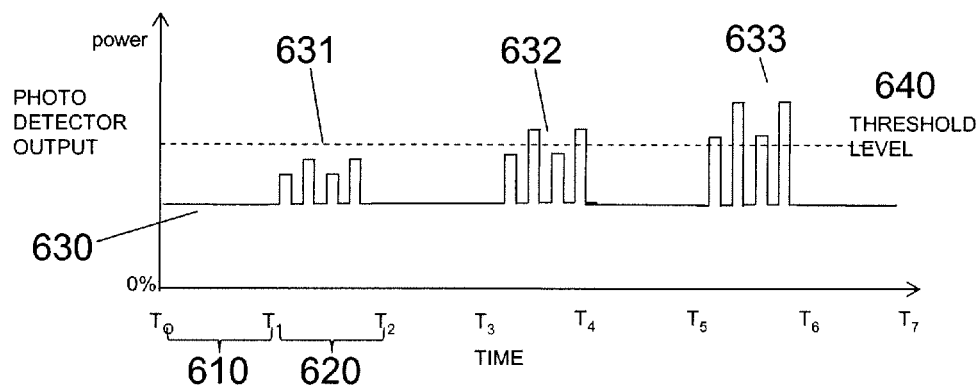
FIG. 6 shows a graphical representation of output power level of the photo detector in the plasmonic ambient light sensor.
Figure 7:
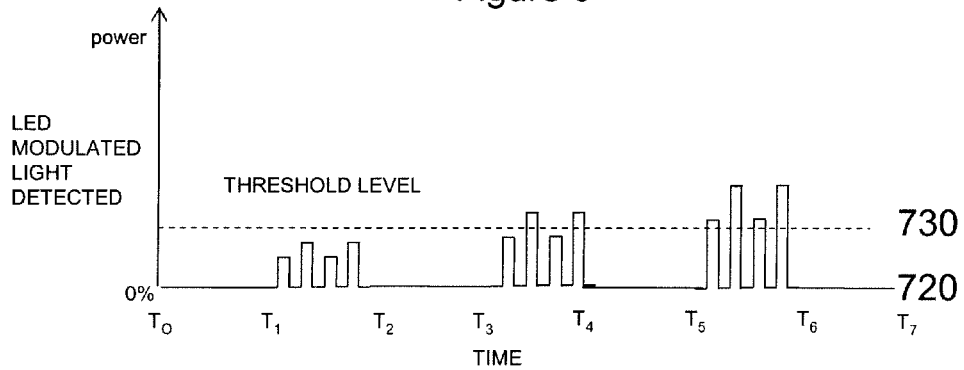
FIG. 7 shows a graphical representation of net output power level of the photo detector, the power level difference between ambient light sensor mode and proximity sensor mode.

As shown in FIG. 6, during the ambient light sensing period or mode 610, the output 630 of the detector 400 represents the power level of the ambient light within the plasmonic ambient light sensor spectral response ranges. During the proximity sensing period or mode 620, the output 630 of detector represents the combined power level of the ambient light within the plasmonic ambient light sensor spectral response ranges, and the light emitted from the LED (which is reflected from object 480 back into the detector 400). Since the output of LED is modulated, the modulated signal 631 shows up on top of the ambient light power level. As the object 480 in FIG. 4 gets closer to the integrated proximity sensor 400 in FIG. 4, the power level of modulated signal 632 gets higher. When the object 480 in FIG. 4 comes in within a certain distance 490, the power level of modulated signal 633 goes higher than a predefined threshold level 640. To get the power level of modulated signal detected as shown in FIG. 7, the signal level detected during the proximity period is subtracted by the signal level detected during immediate prior the ambient light sensing period to provide the net LED power level detected 720. When this net LED power level detected goes above the predefined threshold level 730, this event now can be used as a trigger to either turn off the display or turn off the touch screen input function of the mobile devices.

Since the light from the LED 420 in FIG. 4 is visible, the LED can also be used as an indicator light to show visually that there is incoming call or that a message arrived on the mobile device. The emitter LED 420 may be activated to emit light only after dial completion to make a call, or only after a call connection is set up when the sensor 400 is used in a mobile phone.

Although the foregoing refers to particular preferred embodiments, it will be understood that the present invention is not so limited. It will occur to those of ordinary skill in the art that various modifications may be made to the disclosed embodiments and that such modifications are intended to be within the scope of the present invention.

All of the publications, patent applications and patents cited in this specification are incorporated herein by reference in their entirety.

What is claimed is:

1. A plasmonic ambient light sensor, comprising:
a photodetector; and a plasmonic optical filter comprising a metallic plasmonic structure;

wherein the photodetector and the plasmonic optical filter are provided in the plasmonic ambient light sensor, and wherein a combined spectral sensitivity of said photodetector and said plasmonic optical filter is tuned close to human eye spectral sensitivity.

2. An ambient light sensor set forth in claim 1, wherein:

the metallic plasmonic structure comprises a plurality of metal islands, or multiple apertures in a metal film, or a metal embossing array;

said metallic plasmonic structure is configured such that incident light is resonant with at least one plasmon mode on the structure; and a predetermined wavelength will perturb the metallic plasmonic structures in surface plasmon energy bands for the wavelength selective transmission of light.

3. A visible wavelength range proximity sensor, comprising:

a visible light emitter with a peak wavelength in a visible wavelength range;

a plasmonic ambient light sensor; and a processor in which a proximity sensing mode and an ambient light sensing mode are time multiplexed.

4. A visual range proximity sensor set forth in claim 3, wherein said emitter has a peak wavelength between 540 nm and 570 nm.

5. A visual range proximity sensor set forth in claim 3, wherein:

said plasmonic ambient light sensor comprises a plasmonic optical filter comprising a metallic plasmonic structure selected from a plurality of metal islands, multiple apertures in metal film or metal embossing array;

incident light is resonant with at least one plasmon mode on the structure; and a predetermined wavelength will perturb the metallic plasmonic structure in surface plasmon energy bands for the wavelength selective transmission of light.

6. A visual range proximity sensor set forth in claim 3, wherein in operation, said emitter emits light during proximity sensing mode and said emitter turns off during ambient light sensing mode.

7. A visual range proximity sensor set forth in claim 3, wherein in operation, the emitter emits light with at least one of frequency modulation or amplitude modulation.

8. A visual range proximity sensor set forth in claim 3, wherein said visual range proximity sensor further comprises modulation unit to generate the modulation signal.

9. A visual range proximity sensor set forth in claim 8, wherein said proximity sensor further comprises a subtraction unit to extract the modulation signal from background ambient light.

10. A visual range proximity sensor set forth in claim 3, wherein the proximity sensor is integrated into a mobile phone, such that in operation, said emitter is activated to emit light only after dial completion to make a call, or only after a call connection is set up.

11. A visual range proximity sensor set forth in claim 3, wherein the proximity sensor is integrated into a mobile device, such that in operation said emitter is used as an indicator light to indicate at least one of an incoming call or that a message has arrived.

12. A visual range proximity sensor set forth in claim 3, wherein said emitter is located separately from the plasmonic ambient light sensor.

13. A visual range proximity sensor, comprising:

a visible light emitter with a peak wavelength in a visible wavelength range;

an ambient light sensor having a spectral response similar to human eye spectral response; and a processor in which a proximity sensing mode and an ambient light sensing mode are time multiplexed.

14. A method of using an integrated proximity and ambient light sensor, comprising:

emitting light with a peak wavelength in a visible wavelength range and sensing a proximity of an object from which the light reflects in a proximity mode using the integrated sensor; and sensing an amount of ambient light in an ambient light sensing mode using the integrated sensor;

wherein the proximity sensing mode and the ambient light sensing mode are time multiplexed.

15. A method of claim 14, wherein:

said integrated sensor comprises an ambient light sensor comprising a plasmonic optical filter comprising a metallic plasmonic structure selected from a plurality of metal islands, multiple apertures in metal film or metal embossing array;

incident light on the ambient light sensor is resonant with at least one plasmon mode on the metallic plasmonic structure; and a predetermined wavelength perturbs the metallic plasmonic structure in surface plasmon energy bands for the wavelength selective transmission of light.

16. A method of claim 14, wherein said light is emitted during a proximity sensing mode and is turned off during an ambient light sensing mode.

17. A method of claim 14, wherein said light is emitted with at least one of frequency modulation or amplitude modulation.

18. A method of claim 14, wherein further comprising generating a modulation signal and extracting modulated light from background ambient light.

19. A method of claim 14, wherein the sensor is integrated into a mobile phone, such that in operation of the phone, said light is emitted only after dial completion to make a call, or only after a call connection is set up.

20. A method of claim 14, wherein the sensor is integrated into a mobile device, such that in operation of the device said light is used as an indicator light to indicate at least one of an incoming call or that a message has arrived.

21. A method of claim 14, wherein said light has a peak wavelength between 540 nm and 570 nm.

* * * * *